United States Patent
Biber et al.

(10) Patent No.: US 9,091,743 B2
(45) Date of Patent: Jul. 28, 2015

(54) LOCAL SCREEN AND METHOD FOR THE SCREENING OUT OF MAGNETIC RESONANCE SIGNALS

(71) Applicants: Stephan Biber, Erlangen (DE); Jörg Rothard, Litzendorf (DE)

(72) Inventors: Stephan Biber, Erlangen (DE); Jörg Rothard, Litzendorf (DE)

(73) Assignee: Siemens Aktiengesellschaft, München (DE)

( * ) Notice: Subject to any disclaimer, the term of this patent is extended or adjusted under 35 U.S.C. 154(b) by 83 days.

(21) Appl. No.: 13/783,288

(22) Filed: Mar. 2, 2013

(65) Prior Publication Data
US 2013/0229178 A1    Sep. 5, 2013

(30) Foreign Application Priority Data
Mar. 2, 2012    (DE) .......................... 10 2012 203 331

(51) Int. Cl.
| | |
|---|---|
| *G01V 3/00* | (2006.01) |
| *G01R 33/421* | (2006.01) |
| *G01R 33/422* | (2006.01) |
| *G01R 33/36* | (2006.01) |

(52) U.S. Cl.
CPC ............ *G01R 33/421* (2013.01); *G01R 33/422* (2013.01); *G01R 33/3664* (2013.01)

(58) Field of Classification Search
CPC ..................................................... G01R 33/422
USPC ................................................. 324/300–322
See application file for complete search history.

(56) References Cited

U.S. PATENT DOCUMENTS

| | | | | |
|---|---|---|---|---|
| 5,159,929 | A | * | 11/1992 | Morris et al. ................. 600/411 |
| 5,374,895 | A | * | 12/1994 | Lee et al. ........................ 330/51 |
| 7,230,425 | B2 | * | 6/2007 | Leussler ....................... 324/318 |
| 8,436,614 | B2 | | 5/2013 | Biber et al. |
| 2010/0039111 | A1 | * | 2/2010 | Luekeke et al. ............... 324/318 |
| 2010/0156412 | A1 | * | 6/2010 | Biber et al. ................... 324/307 |
| 2014/0253122 | A1 | * | 9/2014 | Leussler et al. ............... 324/309 |

FOREIGN PATENT DOCUMENTS

| | | |
|---|---|---|
| DE | 10 2008 063 457 B3 | 6/2010 |
| JP | 08-252234 A | 10/1996 |

OTHER PUBLICATIONS

German Office Action dated Oct. 25, 2012 for corresponding German Patent Application No. DE 10 2012 203 331.9 with English translation.

* cited by examiner

*Primary Examiner* — Melissa Koval
*Assistant Examiner* — Daniel Miller

(57) ABSTRACT

A local screen screens out magnetic resonance signals of an object under examination during magnetic resonance imaging with a magnetic resonance device. The local screen includes a plurality of electrically conductive local screen elements that are arranged such that no direct electrically conductive connection pertains between the local screen elements. The local screen further includes a carrier device for accommodating the local screen elements and a number of switching devices that are connected in an electrically conductive manner to the local screen element, and are embodied such that the electrical resistance may be controlled by a number of screen control signals. In addition, the local screen includes a number of screen control signal inputs for the number of screen control signals.

19 Claims, 6 Drawing Sheets

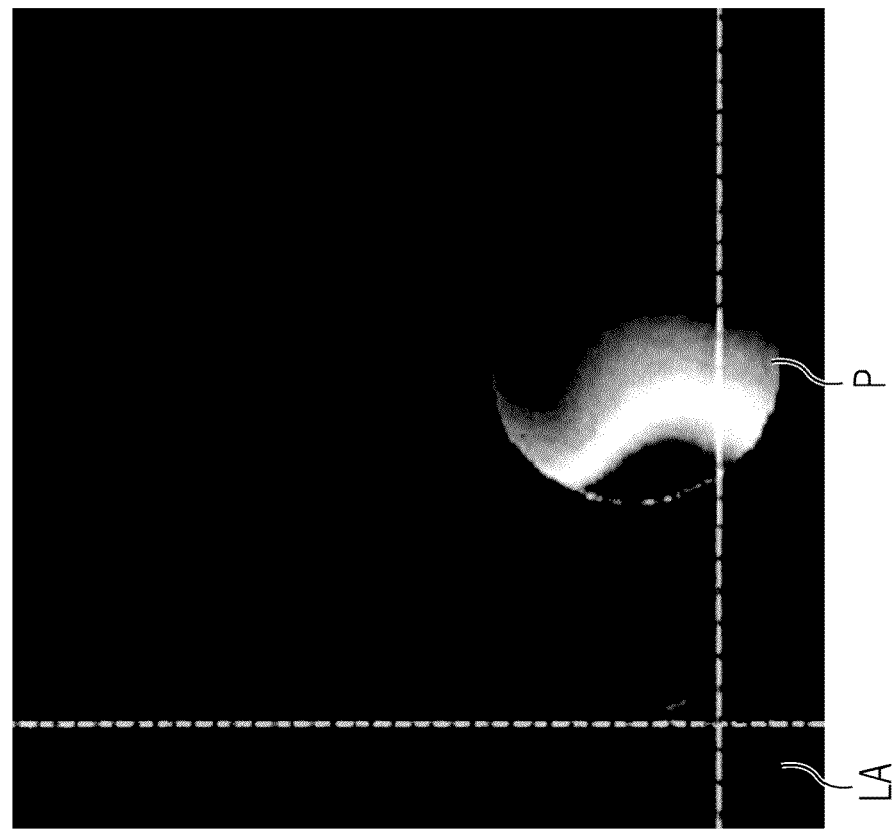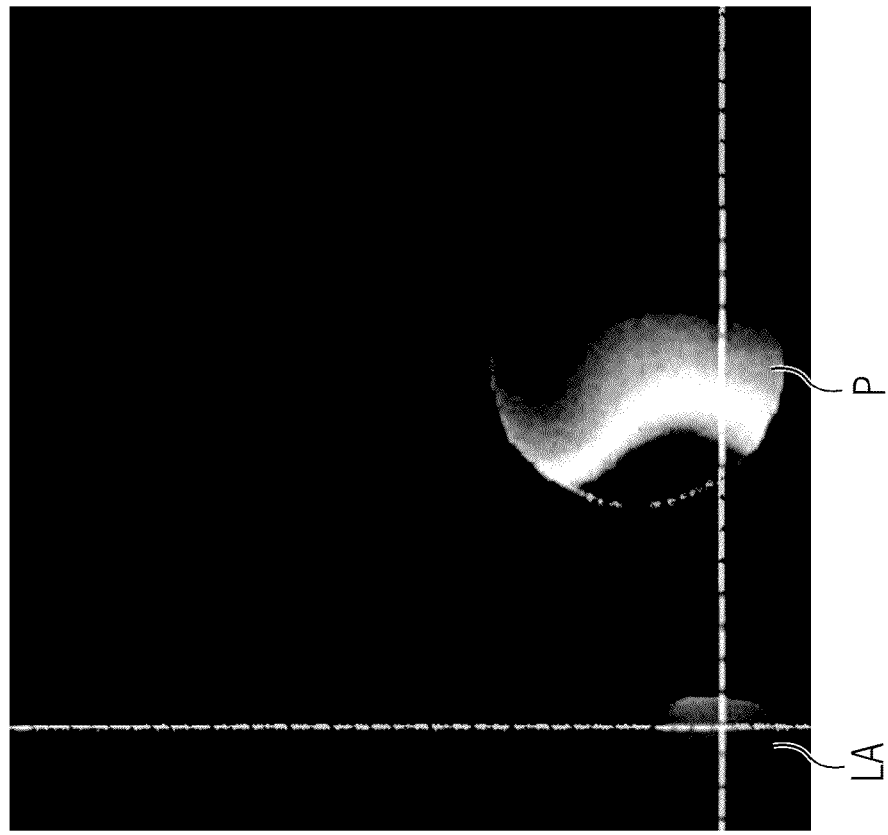
FIG 8

LOCAL SCREEN AND METHOD FOR THE SCREENING OUT OF MAGNETIC RESONANCE SIGNALS This application claims the benefit of DE 10 2012 203 331.9, filed on Mar. 2, 2012, which is hereby incorporated by reference.

BACKGROUND

The present embodiments relate to a local screen for the screening out of magnetic resonance signals of an object under examination during magnetic resonance imaging with a magnetic resonance device.

Imaging systems in medical technology are acquiring a significant role in the non-invasive examination of patients. The representations produced by the imaging systems of the internal organs and structures of the patient are used for the diagnosis of the causes of illness, the planning of operations, the performance of operations, or for the preparation of therapeutic measures. Examples of such imaging systems are ultrasound systems, X-ray computer tomography (CT) systems, positron emission tomography (PET) systems, single-photon emission tomography (SPECT) systems, or magnetic resonance (MR) systems.

With the MR systems, the patient may be subjected to a constant main magnetic field with a relatively high magnetic field strength (e.g., the B0 field). In addition to this, in order to allow for local resolution during the imaging, magnetic gradient fields are overlaid in the different spatial directions. In this situation, the gradient fields may be varied in field strength during the image data acquisition. From time to time, the gradient fields are also activated or deactivated. The variation in the gradient fields, in medical practice, may function at frequencies in the kHz range. In addition to the main magnetic field and the magnetic gradient fields, the patient is also subjected to a pulsed high-frequency field in the MHz range. This field, also designated as the MR excitation field, causes an excitation of the nuclear spin of the atoms or molecules (e.g., the hydrogen protons) in the body of the patient for nuclear spin resonance. After deactivation of the MR excitation field, the excited materials emit MR signals that are recorded by suitable receiver antennae. Due to the fact that the hydrogen protons are found predominantly in the regions of the patient's body that are rich in water and fat, by subsequent calculation operations by an MR system, slice images (tomograms), in which, for example, the regions that are richer in water and fat are represented as lighter than regions that are poorer in water and fat, such as bony structures, may be produced.

For the receiving of the MR signals of the object under examination, local coils are used. The local coils are MR receiving antennae modules that contain MR receiving antenna elements (e.g., conductor loops). The MR signals received by the MR receiving antenna elements are pre-amplified while still in the local coil, are conducted out of the central area of the MR system, for example, via cables, and conducted to a screened receiver of an MR-signal processing device. In this device, the received data is digitalized and further processed for the MR imaging.

During the examination, the local coils are arranged relatively close to the surface of the body, as far as possible directly on the organ or part of the body of the patient that is to be examined. By contrast with larger antennae arranged further away from the patient, which are likewise used for producing an overall sectional image through a patient, the local coils have the advantage that the local coils are arranged closer to the regions of interest. As a result, the noise proportion caused by the electrical losses inside the patient's body is reduced, which leads to the signal-to-noise ratio (SNR) of a local coil being in principle better than that of a more remote antenna. The signal-to-noise ratio may, however, be interfered with by signals emitted from regions of the patient's body that do not belong to the region of interest. This is due to the fact that the high-frequency excitation of the protons of the object under examination during the MR imaging may put into effect by a whole-body antenna, the "remote body array" or "remote body coil". This provides that the regions of the patient's body that are outside the region of interest are also jointly excited. MR signals that impair the measuring of the MR signals from the regions of interest are accordingly also emitted from these regions. For example, this may lead to backfolding or infolding artifacts in the MR image data if the regions of the body that are not of interest do not lie within the field of view, but nevertheless still produce MR signals in the local coils. Such artifacts in MR imaging occur, for example, in the examination of the abdomen or of the heart, since interfering MR signals are emitted from the arms of the patient, which are spatially relatively close to these regions of the body.

SUMMARY AND DESCRIPTION

There is a need for solutions for a form of MR imaging in which the interfering influence of regions of the patient's body not being examined on the quality of the MR imaging is reduced or even eliminated.

As a solution to this problem, for example, a larger image range may be acquired by increasing the number of local coils used or by additional whole body receiving antennae during the MR imaging. As a result, the infolding artifacts would not occur. After an MR image data acquisition, compensation may be provided for the imaging artifacts from regions of the body that are not of interest. Such a solution, however, would incur a disadvantageous increased duration of the MR imaging, and also a disadvantageously increased MR image data volume.

The present embodiments may obviate one or more of the drawbacks or limitations in the related art. For example, a device and a method for MR imaging with an MR device with which interfering influence of regions of a patient or an object under examination that are not of interest is reduced or eliminated are provided.

A local screen for screening of MR signals from an object under examination during MR imaging with an MR device includes a plurality of electrically conductive local screen elements that are arranged such that no direct electrically conductive connection exists between the local screen elements. An object under examination may be a patient, but other objects under examination such as healthy persons undergoing a precautionary examination, or examinations of animals may also be provided. The term "plurality" may be at least two or more than two local screen elements. The geometry of the local screen elements is, for example, flat (e.g., dimensions in one of the three spatial axes are substantially smaller than the dimensions in the two other spatial axes; by a factor of five). As electrically conductive materials, metals such as copper, sheet steel, or aluminum, as well as metal combinations such as alloys may be used. In addition to this, the local screen elements may include non-metallic but electrically-conductive materials such as carbon, carbon fiber, or composite materials made of carbon fibers.

The arrangement of the local screen elements is selected such that no direct electrically conductive connection exists between the local screen elements (e.g., the local screen elements are provided at least in part regions with an electrically isolating material) such that no electrically conductive connection occurs if the local screen elements are touched. The local screen elements may also be arranged at a spatial distance from one another, such that the local screen elements do not touch one another and, accordingly, no direct electrically conductive connection may occur. The local screen elements are located, for example, relatively close to one another, such that the local screen elements form a kind of network. Such an arrangement does not, however, require that the local screen elements are arranged in one plane. Embodiments in which the local screen elements are arranged at a spatial distance behind one another but overlapping may be provided. A possible distance between the local screen elements may be a maximum of some mm. For example, the distance is adjusted to the frequency of the MR excitation field.

The local screen further includes a carrier device to accommodate the local screen elements. The carrier device may surround the local screen elements in whole or in part. For example, the carrier device is structured with materials that exhibit only slight or no electrical conductivity. In addition, the local screen includes a number of switching devices (e.g., one or more switching device) that are connected to the local screen elements in an electrically conductive manner. The switching devices are configured such that electrical resistance of the switching devices may be controlled by a number of screen control signals. The local screen includes a number of screen control signal inputs for the number of screen control signals. The screen control signals may be imposed on the local screen optically, wirelessly, by wire connection, or in other embodiments. Accordingly, the screen control signal inputs are prepared for optical, wireless, wire-connected, or other embodiments of the screen control signals.

The local screen exhibits the substantial advantage that the screening effect or transparency of the local screen with respect to electromagnetic fields may be controlled by the screen control signals. The controllability of the screening effect is achieved in this situation by a corresponding controlling of the electrical resistances of the switching devices.

If, for example, in one embodiment of the local screen, the local screen elements are connected to one another in pairs in an electrically conductive manner via switching devices, a screening effect that is dependent on the resistance values of the switching devices is achieved. The electrically conductive local screen elements have an effect that approximates a large electrically conductive total screen surface in the event of the electrical resistances of the switching devices being controlled to a very low value such as less than 1 Ohm. The effective total screen surface is defined in a close approximation by the spatial overlapping of the individual local screen elements. Conversely, in certain frequency ranges, a lesser screening effect is incurred as a function of the dimensions of the local screen elements in the event of the electrical resistance being controlled to a relatively high resistance value (e.g., greater than 100 kOhm). The local screen elements are therefore close to being electrically isolated from one another and therefore take effect in each case as individual screens that are smaller in relation to the total screen surface.

With a controllable screening effect of this kind of the local screen, the MR signals of regions of the body that are not of interest may be analyzed during the MR imaging and compensated if appropriate. Accordingly, for example, by a comparison of the MR images with increased and reduced screening effect, what influence the regions of the body that are not of interest are exerting on the MR image data may be determined. The screening effect of the local screen may be reduced in the event of the eddy currents induced in the local screen during the MR imaging incurring increased temperatures in the local screen. As a result of a control arrangement of this type, larger body regions may be screened out, or the local screen may be placed very close to the patient's body, since heating of the local screen is avoidable. Conventional simple screening based on large-surface copper films would, in this case, during an MR imaging, lead to heating due to induced eddy currents that may be perceived as unpleasant by the patient.

The local screen may thus allow for screening close to the body of MR signals from regions of the body that are not of interest, such that the imaging artifacts are reduced or avoided altogether, simply and cost effectively (e.g., without an enlargement of the imaging area).

One embodiment of the method for the screening out of MR signals from an object under examination during MR imaging with an MR device includes controlling the degree of the screening effect of a suitable local screen as a function of the phases of the MR imaging. The local screen is located at or in immediate proximity to regions of the body of the object under examination, the MR signals from which are to be screened out.

A reduced screening effect is activated at least during an excitation phase of the MR imaging. The reduced screening effect occurs at least in a frequency range that includes the working frequency of the MR device. The term "working frequency" of the MR device may be the frequency at which protons or atomic nuclei present in the patient are excited to nuclear spin resonance (e.g., the working frequency corresponds to the frequency of the pulsed high-frequency field). With an MR device with 1.5 Tesla, this may be a frequency of 63.5 MHz, with 2.9 Tesla, a frequency of 123.2 MHz, and with 7 Tesla, a frequency of 300 MHz, inasmuch as, it is intended that the hydrogen protons is to be excited. The method may also be used at other frequencies or for the excitation of other protons or atomic nuclei. The term "reduced screening effect" may also include almost complete suspension of the screening effect (e.g., that the screening effect is deactivated; depending on the structure of the local screen and the working frequency used).

With the method, an enhanced screening effect of the local screen is activated during a receiving phase of the MR imaging. The enhanced screening effect occurs at least in a frequency range that includes the working frequency of the MR device. Accordingly, the method allows for a screening of MR signals from regions of the body not of interest during the receiving phase of the MR signals. Due to a reduced screening effect during the excitation phase, the possibility of elevated temperatures that are unpleasant for the patient being incurred by the eddy currents is prevented. Objects (e.g., electrically conductive objects) that are located in the high-frequency MR excitation field may lead to an undesirable distortion of the MR excitation field. This, therefore, also relates to screening devices that are located in the MR excitation field. With the method, the interfering effect of a screening on the MR excitation field is advantageously reduced or even eliminated, since the local screen exhibits a reduced screening effect during the excitation phase (e.g., the local screen is close to being transparent for the MR excitation field).

The description of one category may also by analogy be further developed with respect to the description of one of the other categories.

In one embodiment of the local screen, the local screen includes a localizing device that is configured such that, with the MR device, the position of the local screen may be determined. The localizing device may be configured such that the determination of the position is effected optically, electromagnetically, or acoustically. Accordingly, the localization device may exhibit suitable interfaces. These include optical interfaces such as laser diodes or light-emitting diodes, antennae for electromagnetic waves such as, for example, integrated radio frequency identification (RFID) antennae or ultrasonic transducers. In addition to this, simple non-electrically active markings that are attached to the local screen and facilitate a determination of the position of the local screen (e.g., markings that may be acquired with an optical camera) may also be provided. The possibility of position determination offers the advantage that erroneous positionings of the local screen may be easily identified by the MR device or the medical personnel (e.g., before the beginning of an MR imaging). Risks of interference are therefore avoidable. Knowledge of the precise location of the local screen allows for imaging artifacts derived from the use of the local screen to be more easily compensated.

The localization device may include a local receiving antenna device. The local receiving antenna device may receive the MR excitation fields, and, for example, the MR signals that are emitted from the body of the patient as a reaction to the MR excitation. Such a local receiving antenna device may include one or more simple coil arrangements such as, for example, conductor loops, but may also contain a plurality of loop arrangements such as matrix-type arrangements of conductor loops. The signals received by the local receiving antenna device, if appropriate after pre-amplification and/or analog-digital conversion, are forwarded via suitable wireless, wire-bound, or optical interface signals to the MR device. With further signal processing devices, the position of the local screen may be determined by these signals, such that the advantages referred to heretofore may be achieved.

In a further embodiment of the local screen, the local screen (e.g., the localization device) includes a storage device for storing an identification code. Such a storage device may be configured as an analog or digital memory. The reading out or transferring of the identification code to an MR device may again be effected with suitable wire-bound, wireless, or optical signals. With the aid of the identification code, the MR device or the medical personnel may easily identify which type or which design of local screen is present, and how many local screens are being used. This allows for erroneous procedures and safety risks to be reduced or avoided. In addition to this, with an awareness of the type or embodiment of the local screen, the further processing of the MR signals may be advantageously adapted to the specific properties of the respective local screen.

In one embodiment of the local screen, the dimensions of the local screen elements are selected such that, in a frequency range that includes the working frequency of the MR device, the local screen elements exhibit a high screening effect. For example, the flat local screen elements are configured such that the flat local screen elements have a thickness in the range from approximately 10 um to approximately 200 um, and a length and/or width of maximum 20 mm and/or minimum 5 mm (e.g., approximately 10 mm).

The number of switching devices of the local screen may be configured in different ways. For example, simple mechanical switches that are switched on and off by one of the screen control signals may be provided. These design variants also include, for example, relay switches and vacuum relay switches that, in the switched off state, are characterized by a very high, almost infinite, electrical resistance, and, conversely, in the switched on state, have a very low electrical resistance (e.g., below 1 Ohm).

In one embodiment of the local screen, at least a part of the switching devices are configured as high-pass filters. At higher frequencies of the signals that are to be screened, the switching devices have a lower resistance than at lower frequencies. Such an embodiment of a switching device may be achieved, for example, by the serial connection of a switch with a capacitor. In a closed state (e.g., low-resistance state) of the switch, the switching device may then function as a high-pass filter. Accordingly, in an advantageous manner, the situation in which the screening effect of the local screen, in the presence of electromagnetic fields of high frequency, is greater than in the presence of electromagnetic fields of lower frequency may be attained. With the appropriate design of the high-pass filter, an advantageous embodiment of the local screen, with which, in a first frequency range that includes the working frequency of the MR device, a lower electrical resistance pertains in the switching devices than in a second frequency range that is below the first frequency range, is achieved. For example, the second frequency range includes the frequencies with which the magnetic gradient fields are varied during the MR imaging. With the switching devices designed as high-pass filters, this results in a screening effect of the local screen that is less in the second frequency range than in the first frequency range. This advantageously allows for undesirable eddy currents that, due to the magnetic gradient fields, may exert an effect on general screening devices to be reduced or avoided by the local screen.

For example, at least a part of the switching devices of the local screen includes diodes, with which either the anodes or the cathodes of the diodes are connected to one another in an electrically conductive manner via the number of the screen control signals. By a suitable choice of the voltage of the screen control signal, this allows the diodes to be operated either in the non-conducting or reverse direction or the conducting direction. If, for example, a screen control signal is connected to the cathodes of the diodes, then an electrical potential of the screen control signal that is lower than the electrical potential at the anodes of the diodes has the effect that the diodes are operated in the conducting direction. If the difference between the two potentials exceeds the conducting-state voltage of the diodes, then the diode becomes conductive (e.g., the electrical resistance drops perceptibly). Conversely, an electrical potential of the screen control signal that is higher than the potential at the anodes of the diodes has the effect of the diodes being operated in the non-conducting direction and accordingly exhibiting an electrical resistance that is higher than the electrical resistance in the conducting direction. A corresponding control device with the converse arrangement of the electrical potentials may also be provided if the screen control signals are connected to the anodes of the diodes. Using the voltage of the screen control signal, the resistance of the diodes may be varied, and therefore, the screening effect of the local screen may also be varied.

In one embodiment of the local screen, at least a part of the switching devices are designed as positive-intrinsic-negative diodes (PIN) diodes. As with regular diodes, a PIN diode has a p-doped layer that is connected to the anode, and an n-doped layer that is connected to the cathode of the diode. In addition to this, the PIN diode is also provided with a low-doped intrinsic layer that is arranged between the p-doped and the n-doped layer. The expansion of the intrinsic layer depends on the voltage or current, respectively, that is applied at the cathode and anode of the diode. Due to the low doping of the intrinsic layer, the PIN diode (e.g., with a polarity in the non-conducting direction) exhibits a high-pass behavior, since the intrinsic layer functions like a capacitor. Accordingly, a switching device is provided for the local screen. The electrical resistance of the switching device is frequency-dependent. The frequency dependency may be controlled by the potential of the screen control signal or, respectively, by the diode current influenced by the screen control signal. With the appropriate selection of the PIN diodes and of the screen control signal, an advantageous embodiment of the local screen is provided. With the local screen, PIN diodes operating in the non-conducting direction, in a first frequency range that includes the working frequency of the MR device, have a lower electrical resistance in the switching devices than in a second frequency range that is below the first frequency range. For example, the second frequency range includes the frequencies with which the magnetic gradient fields are varied during the MR imaging. This results in a screening effect of the local screen that is lower in the second frequency range than in the first frequency range. Accordingly, to advantage, undesirable eddy currents that may be caused by the magnetic gradient fields in general screening devices are reduced or avoided by the local screen.

As well as diodes, at least a part of the switching devices of the local screen also include transistors (e.g., field-effect transistors (FET)). The transistors may be connected in different variants to the local screen elements. In one embodiment, the screen control signals are connected to the control inputs of the transistors. With bipolar transistors, this may be a basic connection, and with field-effect transistors, this may be a gate connection. The other connections of the transistors are then connected either to the local screen elements or to a further electrical potential. For example, the local screen elements may be connected in an electrically conductive manner to the collector connections of the bipolar transistors, or, respectively, to the drain connections of the field-effect transistors. Accordingly, the emitter connections of bipolar transistors, or, respectively, source connections of field-effect transistors, may be connected in an electrically conductive manner to the further electrical potential. With such an embodiment, the resistances of the transistors are varied by the potential of the screen control signal or by the current affected by the screen control signal, such that the screening effect of the local screen may be adjusted by the screen control signal. As an alternative, embodiments with which the emitter or, respectively, the source connection is connected to the local screen elements may be provided. The collector or, respectively, the drain connection is located at the further electrical potential. In addition to this, the transistors may be wired in diode configuration, and, according to the arrangements present, may be connected to the local screen elements.

For example, the local screen is configured such that the local screen elements and the switching devices are arranged such that the local screen exhibits a high screening effect in a frequency range that includes the working frequency of the magnetic resonance device, at a low electrical resistance of the switching devices, and a low screening effect at a high electrical resistance of the switching devices.

The local screen elements of the local screen are arranged on the carrier device and may also be partially or completely surrounded by the carrier device. For example, the carrier device includes materials that are electrically isolating or exhibit only low electrical conductivity (e.g., in comparison with the electrical conductivity of the local screen elements). In addition to this, the material or materials of the carrier device may be advantageously selected such that the materials have the effect of thermal insulation between the patients and the local screen elements. This is of advantage if, due to eddy currents during the MR imaging, heating of the local screen elements occurs. For example, the local screen is configured such that the local screen is mechanically flexible in at least one spatial direction. Accordingly, the local screen may be positioned before an MR imaging by an adjustment to the anatomical factors of the patient, such that the local screen is located as close as possible to the body regions of the patient that are not of interest. A desirable high screening effect is thus produced in relation to the MR signals from the regions of the body that are not of interest. For example, the carrier device is configured such that the carrier device includes a material of stable form. As a result, the positioning and adjustment of the local screen to the spatial factors of the MR device and the anatomy of the patient becomes possible. Materials based on polyurethane foam or inherently stable plastic films may be used as inherently stable materials, for example.

The local screen elements may be arranged in different ways on the carrier device. The local screen elements may be arranged in a matrix structure. Such an arrangement does not necessarily require as a precondition that the flat local screen elements exhibit a basic rectangular form. Other basic forms such as circular or oval forms arranged in a matrix structure may be provided.

In another embodiment of the local screen, the local screen includes at least two switching devices that are controlled by at least two screen control signals. A first screen control signal controls the electrical resistance of a first group of switching devices, and a second screen control signal controls the electrical resistance of a second group of switching devices. Such an arrangement of the local screen allows for an advantageous simple controlling of the strength of the screening, and an advantageous simple controlling of the spatial expansion of the screening with the aid of the screen control signals. If, for example, the electrical resistance is lowered only for a first group of the switching devices by a first screen control signal, while the electrical resistance of the second group of switching devices remains at a high resistance value, then a medium screening effect that is higher than if all the electrical resistances of all the switching devices were to exhibit a high resistance value but is lower than if all the electrical resistances of all the switching devices were to exhibit a low resistance value. In addition, with larger local screens, the spatial propagation of the screening effect by the grouping of the switching devices, the local screen elements and the screen control signals may be advantageously controlled. If, for example, the switching devices of a first group and the local screen elements connected to the switching devices are spatially separated from a second group of switching devices and local screen elements, then, by an appropriate controlling of the screen control signals, the screening effect of the first group may differ from the screening effect of the second group during the MR imaging. A grouping of this nature and controlling of the local screen is advantageous, for example, when larger body regions of the patient are to be screened out. Thus, for example, a local screen that is dimensioned such that the screen screens out the undesirable MR signals of the arm of a patient may be specified. Using an appropriate grouping of the switching devices and the local screen elements electrically connected to the switching devices, and a suitable group-by-group controlling of the screen control signals, only the MR signals of the lower arm region, only the MR signals of the upper arm region, or even the MR signals of both arm regions may optionally be screened out. Using such an embodiment, time-consuming repositionings of a local screen may be avoided during the examination.

The screen control signals of the local screen may be formed in both analog and digital form. In the case of control by PIN diodes, for example, using an analog electrical voltage, the screening effect of the local screen may be varied in a wide range by a variation of the analog electrical voltage. For example, the local screen is configured such that the number of the screen control signals in each case exhibit two states, and a first state causes a substantially higher electrical resistance of the switching devices than a second state of the screen control signals.

A local screen system for MR imaging includes at least one local screen, and at least one control device that in operation produces the number of screen control signals and in operation is connected to the number of screen control signal inputs of the local screen. For example, in this situation, the control device is configured such that the control device is provided with outputs that may produce screen control signals that are forwarded wirelessly, in a wired manner, or optically to the screen control signal inputs of the local screen. The control device may be arranged directly at the local screen or in the spatial vicinity of the local screen. For example, the control device is arranged spatially separated from the local screen in order to reduce or avoid disadvantageous reciprocal effects between the electromagnetic fields of the MR device and the control device. In addition to the screen control signals, the control device may also provide a number of voltage supplies for the local screen. Such a voltage supply may serve, for example, to supply active electrical or electronic components of the local screen (e.g., active elements in the switching devices or pre-amplifiers of a local receiving antenna device).

An MR system for MR imaging includes an MR device, at least one local screen, and at least one control device that, in operation, produces the number of screen control signals, and issues the screen control signals to the at least one local screen. The control device may be arranged directly at or in the MR device.

In one embodiment of the method, the screening effect of the local screen is controlled by a control device of the MR device by a number of screen control signals (e.g., as a function of parameters of the MR imaging). For example, controlling of this type may take place during an MR imaging in order to achieve an optimized adjustment of the screening effect. This provides, for example, that the screening effect is modified by the MR device or the medical personnel with the aid of the screen control signals if it may be determined, on the basis of the MR image data, that the screening effect is too low or too strong. In addition to this, the local screen may be actuated by the number of screen control signals such that a local screen, subdivided into a plurality of local screen zones, exhibits different strengths of the screening effect in the local screen zones. With imaging sessions in which larger regions of the patient's body are being examined, this advantageously allows for only the local screen zones that at that moment lie in the field of view of the MR imaging to be activated by the MR device or the medical personnel.

BRIEF DESCRIPTION OF THE DRAWINGS

Components of the same type are designated by the same reference numbers. Letters are used for signals, time data, and references to patients and body regions of patients.

FIG. 8 shows exemplary image data from an MR examination of a body model with a local screen.

DETAILED DESCRIPTION

Figure 1:
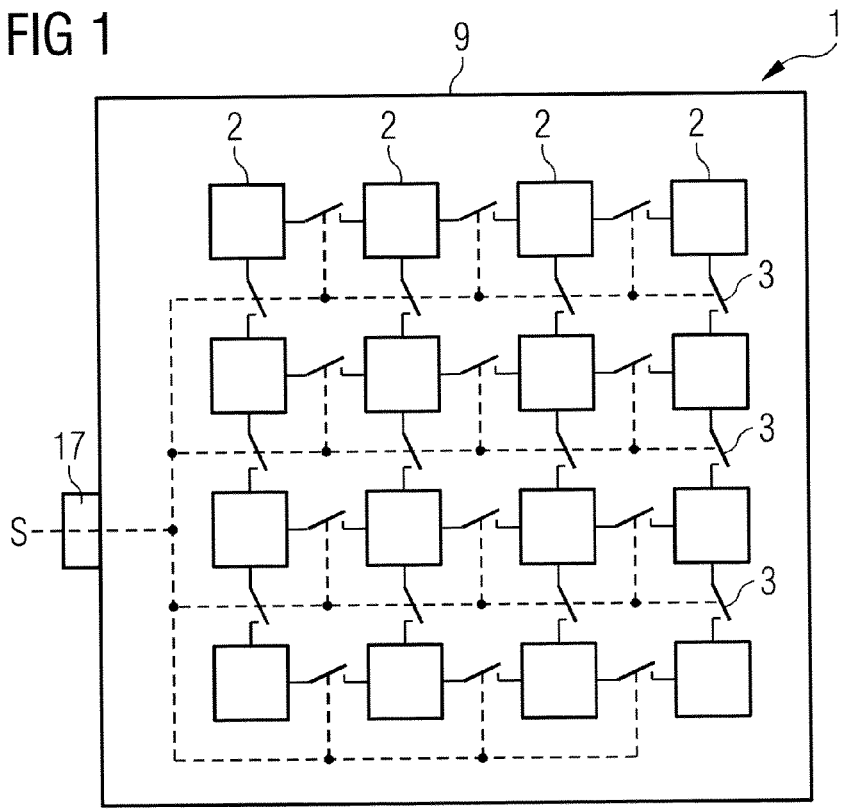
FIG. 1 shows a schematic representation of an embodiment of a local screen.

FIG. 1 shows a schematic representation of an exemplary embodiment of a local screen 1. The local screen 1 includes a number of local screen elements 2 that are arranged in matrix form on a carrier device 9. The local screen elements 2 are connected to one another in an electrically conductive manner in pairs by switching devices 3. The switching devices 3 are controlled by a screen control signal S that is provided via a screen control signal input 17. If the switching devices 3 are set into a low-resistance state by the screen control signal S (e.g., by the closure of a switch or a relay), then all the local screen elements 2 are connected in an electrically conductive manner to one another in low resistance. The individual local screen elements 2 function in this state in a manner approximating a large cohesive screen surface, as a result of which a high screening effect of the local screen 1 is produced. If, by contrast, the switching devices 3 are set by the screen control signal S into a high-resistance state (e.g., by the opening of a switch or a relay), then a perceptibly lower screening effect is attained, and low or no distortion of the MR excitation field during the MR imaging is provided (e.g., with a sufficiently low choice of local screen elements 2). FIG. 1 is of a schematic nature, since with suitable dimensioning, the local screen elements 2 may exhibit a length and width of approximately 10 mm. This provides that a local screen 1 that is dimensioned for the screening of arms LA, RA, or legs of a patient P may include substantially more local screen elements 2 than are shown in FIG. 1. The base of the local screen element 2 is not restricted to rectangular shapes. Other shapes such as circles or ovals may also be provided for the local screen elements 2.

Figure 2:
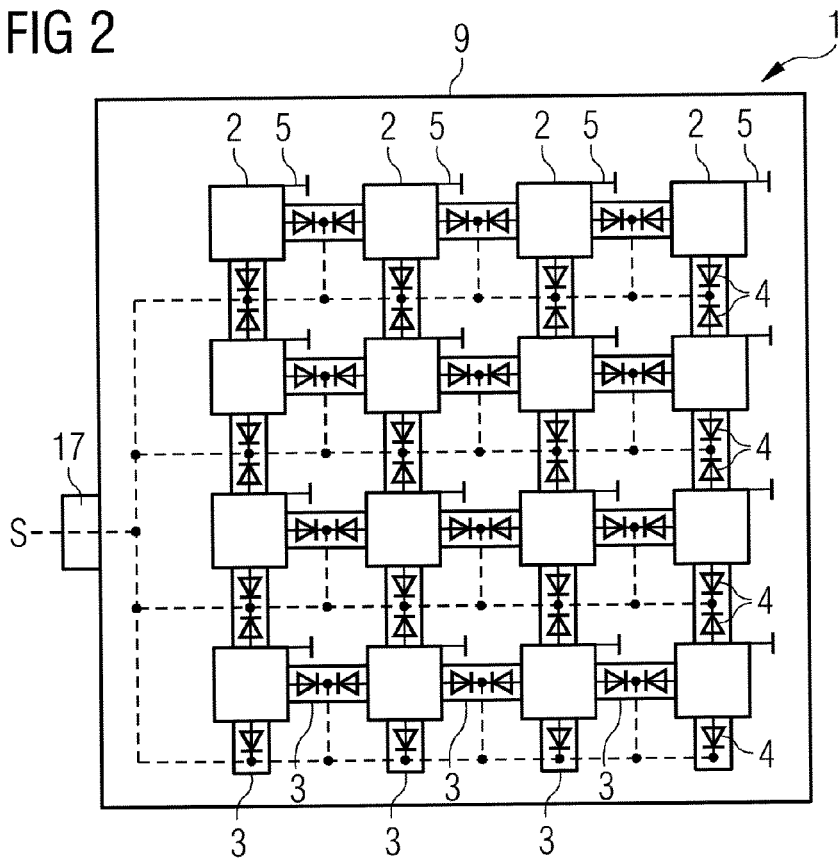
FIG. 2 shows a schematic representation of another embodiment of a local screen.

FIG. 2 represents a schematic representation of an exemplary embodiment of a local screen 1. The local screen elements 2 are arranged in matrix form on the carrier device 9. The screen control signal S is supplied via the screen control signal input 17. In addition, the local screen elements 2 are connected via diodes 4 inside the switching device 3 to the screen control signal S. In this exemplary embodiment, the cathodes of the diodes 4 are connected to the screen control signal S, and the anodes of the diodes 4 are connected to the local screen elements 2 in an electrically conductive manner. An alternative embodiment with reversed polarity of the diodes 4 may also be provided. The resistance of the switching devices 3 is controlled by the screen control signal S. If, for example, the electrical potential of the screen control signal S is less than the electrical potential of the local screen element 2 by at least the diode voltage or diode inception voltage, then the diodes become conductive (e.g., the diodes exhibit low electrical resistance). In accordance with the foregoing embodiments relating to FIG. 1, a screening effect of the local screen that is higher than the screening effect that is incurred if the diodes 4 exhibit a high resistance (e.g., if the diodes are operated in the non-conducting or reverse direction) is produced. Operation in the non-conducting direction occurs when the electrical potential of the screen control signal S lies above the electrical potential of the local screen elements 2. With the embodiment represented in FIG. 2, using the polarity of the screen control signal S, the electrical resistances in the switching devices 3 and therefore the screening effect of the local screen 1 may be controlled.

The diodes 4 in FIG. 2 may be configured as PIN diodes. For frequency-dependent resistances may be realized in the switching devices 3, which advantageously reduce or avoid undesirable eddy currents that otherwise may be brought about by the magnetic gradient fields in general screening devices. The frequency dependency of the resistance of the PIN diodes may be adjusted by a current signal that is injected into the screen control signal S, or by an electrical potential that is applied to the screen control signal S. This may be done by direct current or a DC voltage. An injected direct current is dissipated via a supply voltage 5 that is connected in an electrically conductive manner to the local screen elements 2. The supply voltage 5 may be configured as an earth connection (e.g., a GND connection).

Figure 3:
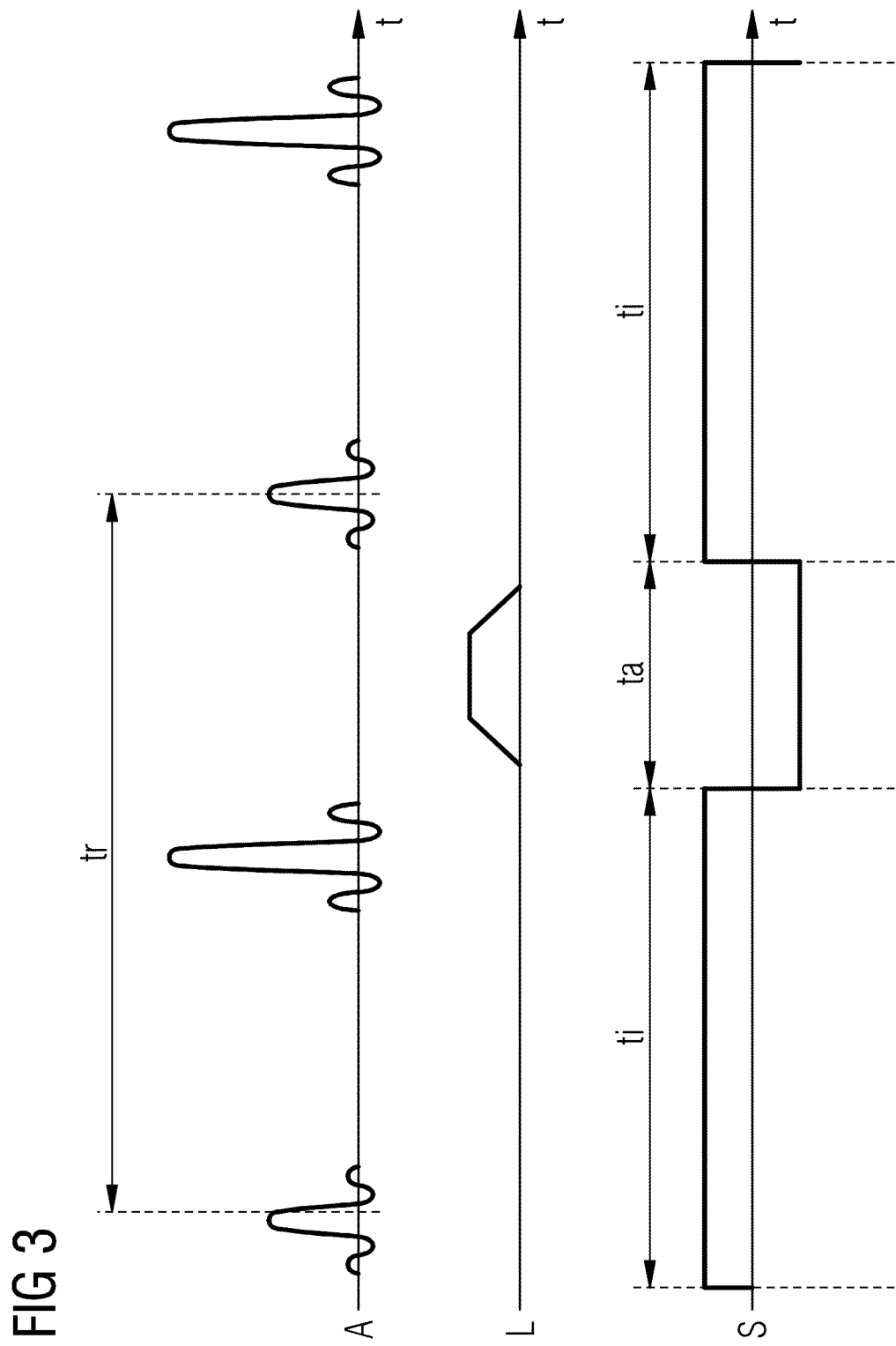
FIG. 3 shows an exemplary temporal sequence of signals from an MR device.

FIG. 3 shows an exemplary temporal sequence of signals from an MR device 13 when emitting a typical transmission pulse sequence during operation. The excitation signal A (topmost time axis) represents the course of the amplitude of the MR excitation field during MR imaging over the time t, which repeats at a repetition time tR. The read-out window L (second time axis from the top) reproduces in rough schematic form the temporal sequence of the MR signals emitting from the body of the patient P (e.g., echoes induced by the excitation and refocusing pulses of the excitation field). FIG. 3 shows the temporal sequence of the screen control signal S (lowest time axis). In one embodiment, the screening effect of the local screen 1 is controlled via the screen control signal S. Accordingly, with an embodiment of the local screen 1 according to FIG. 2, a higher screening effect is produced with an activation of the local screen 1 in the time period ta, since the diodes 4 are being operated in the conducting direction (e.g., the diodes are conductive). By contrast, in a time period ti, the local screen 1 is inactive (e.g., the local screen exhibits a lower screening effect than in the time period ta) since the diodes 4 are being operated in the non-conducting or reverse direction (are non-conducting)). The activation and deactivation of the local screen 1 is selected such that the local screen 1 is not active at least during the excitation by the excitation signal A (e.g., the local screen 1 exhibits a lower screening effect). Accordingly, advantageously minor or even no distortion of the MR excitation field is caused by local screen 1. The local screen 1 is activated at least during the read-out window when MR signals are emitted from the body of the patient P, such that MR signals from regions of the body of the patient P that are not of interest are screened out. For the sake of improved clarity, the gradient pulses inside a pulse sequence are not represented in FIG. 3.

Figure 4:
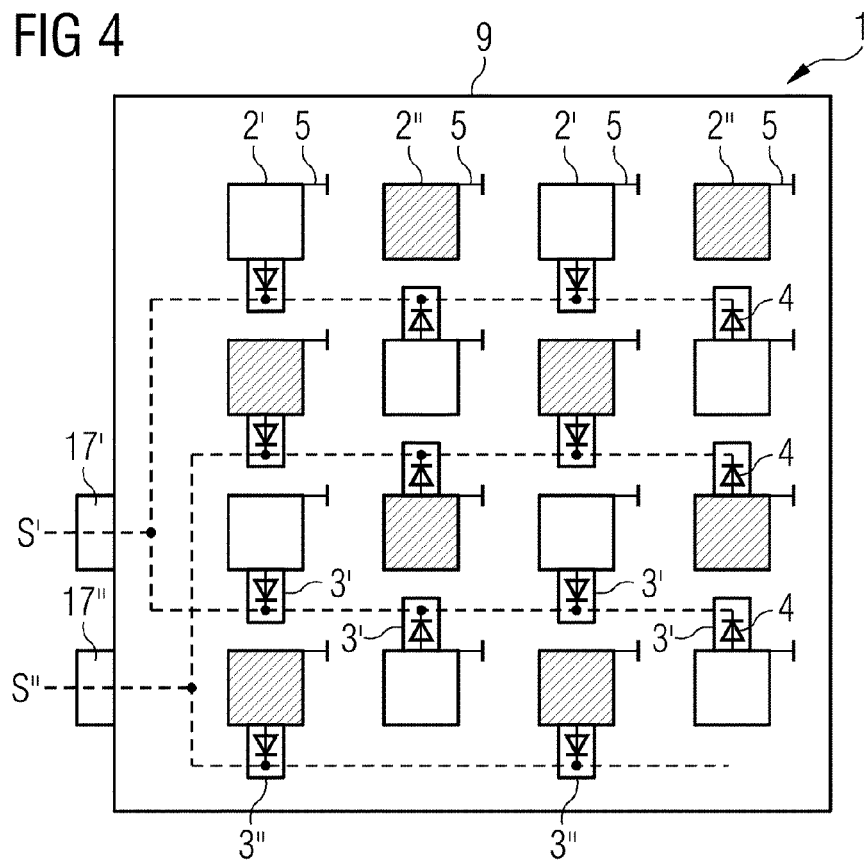
FIG. 4 shows a schematic representation of an embodiment of a local screen.

FIG. 4 is a schematic representation of an exemplary embodiment of a local screen 1. The local screen elements 2', 2" are subdivided into two groups. The local screen elements 2', 2" are allocated in a spatially alternating manner to a first group of local screen elements 2' and a second group of local screen elements 2". The switching devices 3', 3" are allocated accordingly to a first group switching devices 3' and a second group of switching devices 3". The first group of switching devices 3' are connected in an electrically conductive manner to the first group of local screen elements 2' and a first screen control signal S', and the second group of switching devices 3" are connected in an electrically conductive manner to the second group of local screen elements 2" and a second screen control signal S". The local screen elements 2', 2" are arranged in matrix form on a common carrier device 9. The screen control signals S', S" are conducted via screen control signal inputs 17', 17". Notwithstanding the embodiment in FIG. 4, one single screen control signal input 17 may serve to supply the two screen control signals S', S". The switching devices 3', 3" include diodes 4. In such an embodiment of the local screen 1, the screening effect of the first group of the local screen elements 2' may be controlled independently of the screening effect of the second group of local screen elements 2". For example, the screen control signals S', S" may be selected such that the diodes 4 in the switching devices 3' are operated in the non-conducting or reverse direction, and the diodes 4 in the switching devices 3" in the conducting direction. Accordingly, the first group of the local screen elements 2' produces a lower screening effect than the second group of local screen elements 2". In total, this results in an average overall screening effect of the local screen 1. This provides that, with an embodiment of this type, it is advantageously possible to change between a low screening effect, one or more average screening effects, and a high screening effect, by a corresponding activation or deactivation of groups of local screen elements 2', 2".

Figure 5:
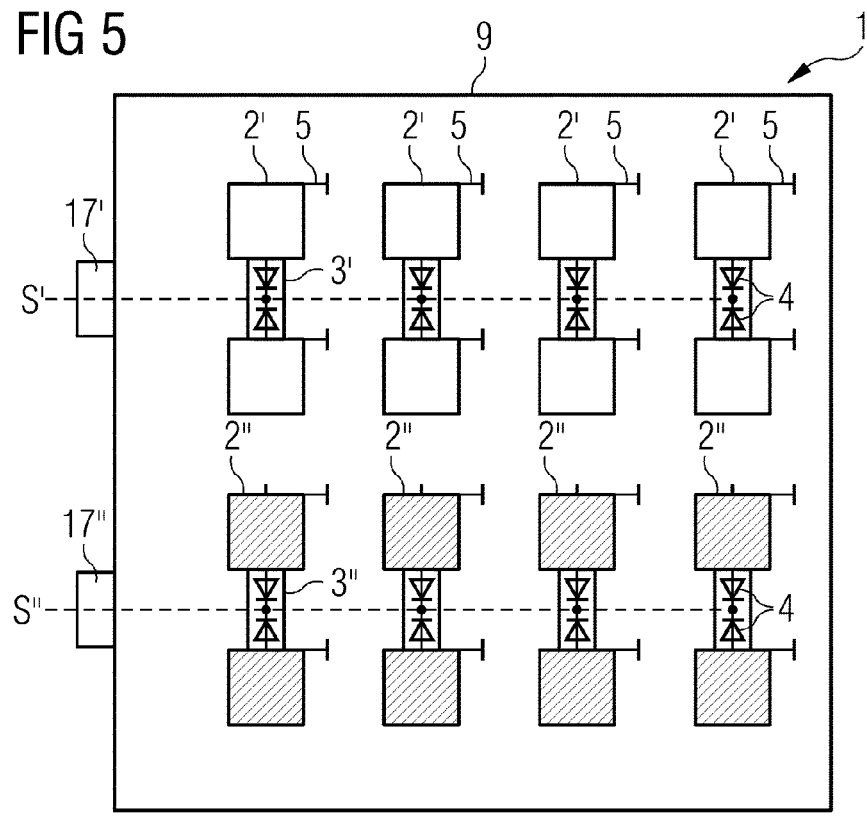
FIG. 5 shows a schematic representation of another embodiment of a local screen.

FIG. 5 shows a schematic representation of an embodiment of a local screen 1. In this situation, the local screen elements 2', 2" are again subdivided into two groups. The local screen elements 2', 2" are allocated, separated into spatial regions, to a first group of local screen elements 2' and a second group of local screen elements 2". The switching devices 3', 3" are correspondingly allocated, separated into spatial regions, to a first group of switching devices 3' and a second group of switching devices 3". The first group of switching devices 3' are connected in an electrically conductive manner to the first group of local screen elements 2' and a first screen control signal S', and the second group of switching devices 3" are connected in an electrically conductive manner to the second group of local screen elements 2" and a second screen control signal S". The screening effect of the first group of local screen elements 2' may be controlled independently of the screening effect of the second group of local screen elements 2". Such an embodiment of the local screen 1 is advantageous, for example, with MR imaging in which larger body regions of the patient P are being examined. This accordingly allows only the regions of the local screen 1 to be activated by the MR device 13 or by the medical personnel that are lying specifically in the field of view of the MR imaging.

Figure 6:
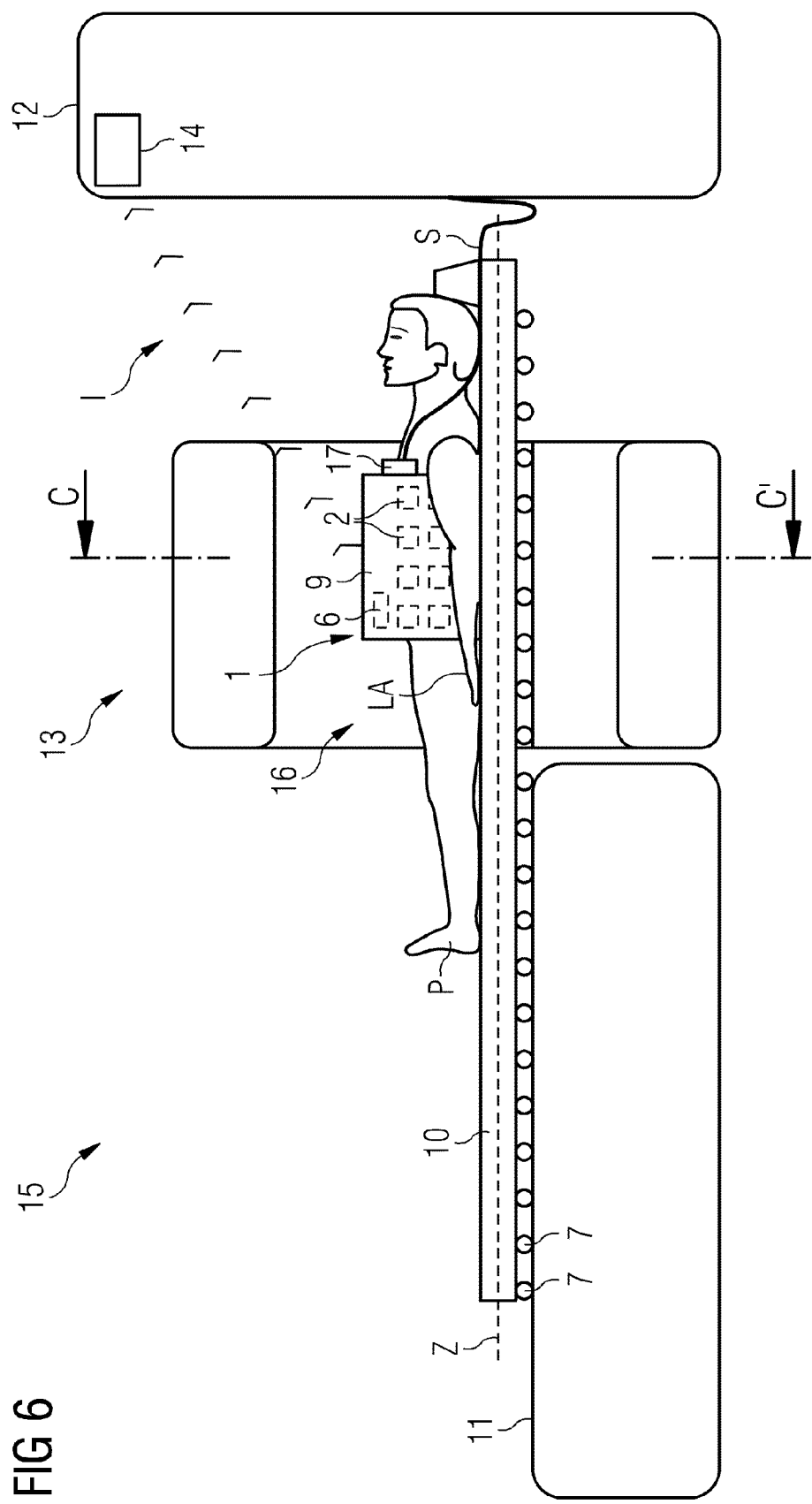
FIG. 6 shows a schematic representation of a side view of one embodiment of an MR system.

FIG. 6 shows a side view of one embodiment of an MR system 15. A patient P is located on a patient couch 10 of an examination table arrangement 11. The patient couch 10 may be moved along a longitudinal axis Z by suitable roller devices 7 in order to position the patient P for the MR imaging in an examination space 16 in the interior region of the MR device 13. Arranged on the left arm LA of a patient P is one embodiment of a local screen 1 with local screen elements 2, a localization device 6, a screen control signal input 17, and a carrier device 9. The localization device 6 transfers localization data or an identification code using an identification signal I to a receiver 14 that is arranged in the control device 12 of the MR device 13. In addition, the control device 12 generates a screen control signal S that is connected to the screen control signal input 17 of the local screen 1.

Further components of an MR device 13 include, for example, control devices in order to be able to actuate basic field magnets and the gradient fields accordingly. The further components also include high-frequency transmitter devices for generating and amplifying the high-frequency pulses in order to transmit the high-frequency pulses via an antenna arrangement. The further components include corresponding receiver devices in order to receive, via antenna arrangement(s), MR signals from the measurement space or from the object P under examination, amplify the MR signals, and subject the MR signals to further processing. In one embodiment, the transmitter and receiver also further exhibit connections in order to be able to connect external local coils that may be located on, under, or at the object P under examination, and may be moved into the measurement space or MR examination space 16 of the MR device 13. For the sake of improved clarity, these components are not represented in FIG. 6. The present embodiments may be used not only with MR devices 13 that exhibit a cylindrical patient tunnel, but also with MR devices 13 of different structure (e.g., with a measurement space open on three sides).

Figure 7:
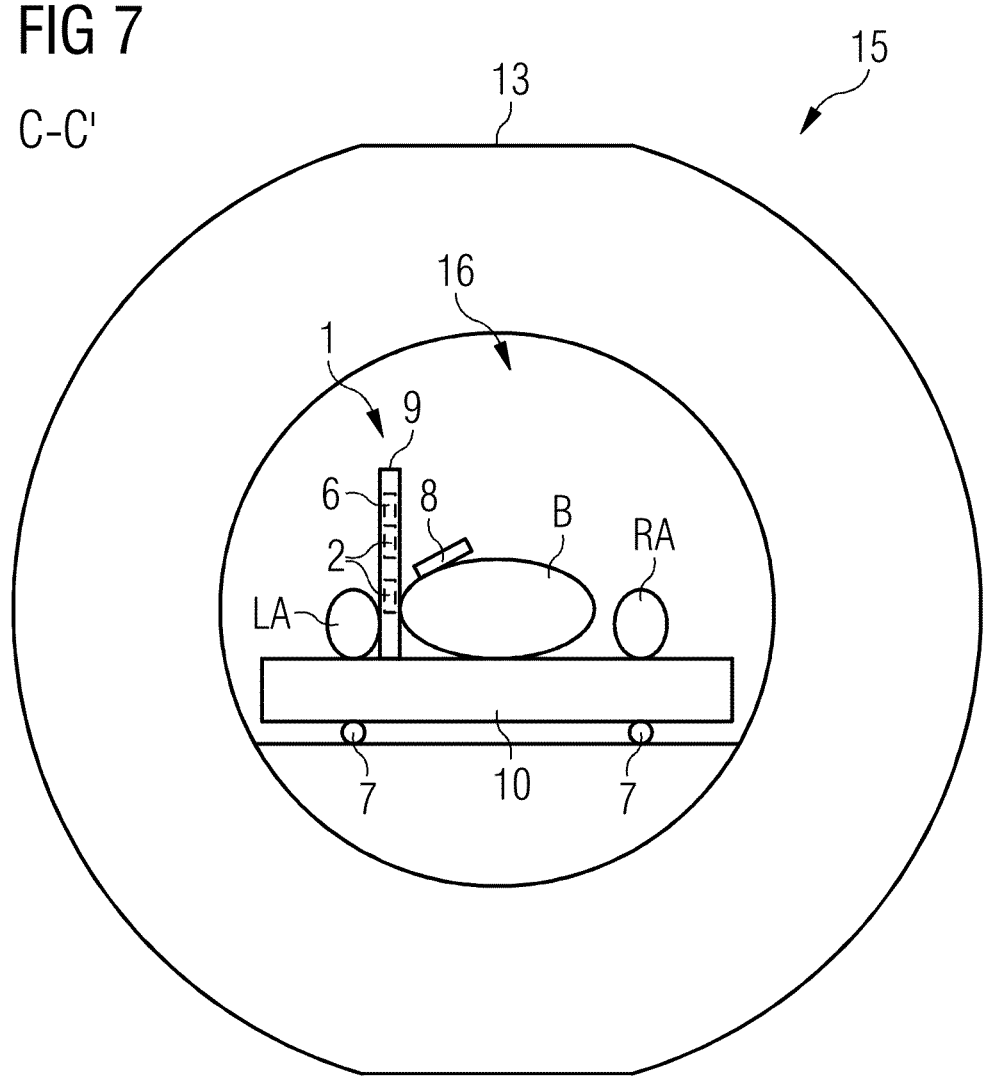
FIG. 7 shows a cross-section through one embodiment of an MR system.

FIG. 7 shows a cross-section through one embodiment of an MR system 15 according to FIG. 6 along the sectional plane C-C'. In addition to the devices shown in FIG. 6, represented in the MR examination space 16 is a local antenna device 8 located on the patient P, which receives the MR signals emitted from the patient P. The local screen 1 is positioned between the left arm LA of the patient P and the chest cavity B of the patient P. As a result, the situation in which the MR signals emitted from the left arm LA of the patient P are screened against the local antenna device 8 is attained. A second local screen 1 may be used on the right arm RA of the patient (e.g., if the local antenna device 8 is to be arranged in the middle on the chest cavity B of the patient P).

FIG. 8 shows exemplary MR image data from an MR examination of a body model, produced via a test, making use of a local screen 1. The body model of the patient P includes a chest cavity B and a model of a left arm LA. The local screen 1 is arranged between the left arm LA and the chest cavity B. This may not be seen in this case in the MR image data itself. On the left side of FIG. 8, the MR image data is reproduced with a local screen 1, with which, using the screen control signals S, S', S'', the screening effect was reduced. The right side of FIG. 8 by contrast shows the MR image data of the same arrangement with an activated local screen 1 (e.g., with a screening effect enhanced by the control signals S, S', S''). From the comparison of the two sets of MR image data, the advantageous effect of the local screen 1 is shown, since in the right-hand image, the undesirable influence of the left arm LA may have been perceptibly reduced.

The local screen and the method described in detail heretofore are only exemplary embodiments that may be modified by the person skilled in the art in the most widely differing manner without departing from the scope of the invention. For example, the local screen elements of a local screen may be connected to differing types of switching devices, if appropriate, also in parallel using different switching devices such as the diodes and transistors discussed above. If these different switching devices exhibit different frequency filter characteristics, then a local screen with selectively chosen or even multimodal filter effect may be realized. The use of the indefinite article "a" or "an" does not exclude the possibility that the features concerned may also be present as a plurality. Likewise, the term "unit" or "module" does not exclude the fact that these may include several components that may also be spatially distributed. The same also applies to the local screen system and the MR device, the components of which may also be arranged spatially separated from one another in different housings.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local screen for screening out magnetic resonance signals from an object under examination during magnetic resonance imaging with a magnetic resonance device, the local screen comprising:
   a plurality of local screen elements that are electrically conductive and are arranged such that no direct electrically conductive connection exists between the plurality of local screen elements;
   a carrier device operable to accommodate the plurality of local screen elements;
   a plurality of switching devices that are connected in an electrically conductive manner to the plurality of local screen elements, the plurality of switching devices being configured such that electrical resistance of the plurality of switching devices is controllable by a plurality of screen control signals; and
   a plurality of screen control signal inputs for the plurality of screen control signals,
   wherein the plurality of local screen elements and the plurality of switching devices are configured such that the local screen exhibits, in a frequency range that comprises a working frequency of the magnetic resonance device, a high screening effect when an electrical resistance of the plurality of switching devices is low, at least during a receiving phase of the magnetic resonance imaging, and a low screening effect when an electrical resistance of the plurality of switching devices is high, at least during an excitation phase of the magnetic resonance imaging.

2. The local screen as claimed in claim 1, wherein the local screen comprises a localization device operable to determine a position of the local screen with the magnetic resonance device.

3. The local screen as claimed in claim 2, wherein the localization device comprises a local receiving antenna device.

4. The local screen as claimed in claim 1, wherein at least a portion of the plurality of switching devices are configured as high-pass filters.

5. The local screen as claimed in claim 1, wherein at least a portion of the plurality of switching devices comprise diodes, and
   wherein either anodes or cathodes of the diodes are connected to one another in an electrically conductive manner by the plurality of screen control signals.

6. The local screen as claimed in claim 5, wherein the diodes are PIN diodes.

7. The local screen as claimed in claim 1, wherein at least a portion of the plurality of switching devices comprise transistors.

8. The local screen as claimed in claim 7, wherein the transistors are field-effect transistors.

9. The local screen as claimed in claim 1, wherein the local screen is mechanically flexible in at least one spatial direction.

10. The local screen as claimed in claim 9, wherein the local screen is configured such that the carrier device comprises an inherently stable material.

11. The local screen as claimed in claim 1, wherein at least two switching devices of the plurality of switching devices are controlled by at least two screen control signals of the plurality of screen control signals, and
    wherein a first screen control signal of the at least two screen control signals is operable to control the electrical resistance of a first group of switching devices of the plurality of switching devices, and a second screen control signal of the at least two screen control signals is operable to control the electrical resistance of a second group of switching devices of the plurality of switching devices.

12. The local screen as claimed in claim 1, wherein each screen control signal of the plurality of screen control signals exhibits two states, a first state of the two states creating a substantially higher electrical resistance of the plurality of switching devices than a second state of the two states.

13. A local screen system for magnetic resonance imaging, the local screen system comprising:
at least one local screen for screening out magnetic resonance signals from an object under examination during the magnetic resonance imaging with a magnetic resonance device, the at least one local screen comprising:
a plurality of local screen elements that are electrically conductive and are arranged such that no direct electrically conductive connection exists between the plurality of local screen elements;
a carrier device operable to accommodate the plurality of local screen elements;
a plurality of switching devices that are connected in an electrically conductive manner to the plurality of local screen elements, the plurality of switching devices being configured such that electrical resistance of the plurality of switching devices is controllable by a plurality of screen control signals; and
a plurality of screen control signal inputs for the plurality of screen control signals; and at least one control device that, during operation, is operable to generate the plurality of screen control signals,
wherein, during operation, the at least one control device is connected to the plurality of screen control signal inputs of the local screen, and
wherein the plurality of local screen elements and the plurality of switching devices are configured such that the local screen exhibits, in a frequency range that comprises a working frequency of the magnetic resonance device, a high screening effect when an electrical resistance of the plurality of switching devices is low, at least during a receiving phase of the magnetic resonance imaging, and a low screening effect when an electrical resistance of the plurality of switching devices is high, at least during an excitation phase of the magnetic resonance imaging.

14. A magnetic resonance system for magnetic resonance imaging, the magnetic resonance system comprising:
a magnetic resonance device;
at least one local screen for screening out magnetic resonance signals from an object under examination during the magnetic resonance imaging with a magnetic resonance device, the at least one local screen comprising:
a plurality of local screen elements that are electrically conductive and are arranged such that no direct electrically conductive connection exists between the plurality of local screen elements;
a carrier device operable to accommodate the plurality of local screen elements;
a plurality of switching devices that are connected in an electrically conductive manner to the plurality of local screen elements, the plurality of switching devices being configured such that electrical resistance of the plurality of switching devices is controllable by a plurality of screen control signals; and
a plurality of screen control signal inputs for the plurality of screen control signals; and
at least one control device that, during operation, is operable to generate the plurality of screen control signals and send the plurality of screen control signals to the at least one local screen,
wherein the plurality of local screen elements and the plurality of switching devices are configured such that the local screen exhibits, in a frequency range that comprises a working frequency of the magnetic resonance device, a high screening effect when an electrical resistance of the plurality of switching devices is low, at least during a receiving phase of the magnetic resonance imaging, and a low screening effect when an electrical resistance of the plurality of switching devices is high, at least during an excitation phase of the magnetic resonance imaging.

15. A method for screening out magnetic resonance signals of an object under examination during magnetic resonance imaging with a magnetic resonance device, the method comprising:
positioning a local screen at or in the immediate vicinity of parts of the body of the object under examination, magnetic resonance signals of which are to be screened out, the local screen comprising a plurality of local screen elements and a plurality of switching devices that are connected in an electrically conductive manner to the plurality of local screen elements;
activating a reduced screening effect of the local screen at least during an excitation phase of the magnetic resonance imaging, wherein the reduced screening effect occurs at least in a frequency range that comprises a working frequency of the magnetic resonance device; and
activating an enhanced screening effect of the local screen during a receiving phase of the magnetic resonance imaging, wherein the enhanced screening effect occurs at least in a frequency range that comprises the working frequency of the magnetic resonance device.

16. The method as claimed in claim 15, further comprising controlling, by a control device of the magnetic resonance device, the screening effect of the local screen using a plurality of screen control signals.

17. The method as claimed in claim 16, wherein the controlling comprises controlling the screening effect of the local screen using the plurality of screen control signals as a function of parameters of the magnetic resonance imaging.

18. The method as claimed in claim 16, further comprising actuating the local screen by the plurality of screen control signals such that the local screen subdivided into a plurality of local screen zones exhibits different strengths of screening effect in the local screen zones.

19. The method as claimed in claim 17, further comprising actuating the local screen by the plurality of screen control signals such that the local screen subdivided into a plurality of local screen zones exhibits different strengths of screening effect in the local screen zones.

* * * * *